(12) United States Patent
Cho et al.

(10) Patent No.: US 7,473,619 B2
(45) Date of Patent: Jan. 6, 2009

(54) METHOD OF FABRICATING SEMICONDUCTOR DEVICE HAVING ALIGNMENT KEY AND SEMICONDUCTOR DEVICE FABRICATED THEREBY

(75) Inventors: Min-Hee Cho, Yongin-si (KR); Yoo-Sang Hwang, Suwon-si (KR); Byung Hyun Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 492 days.

(21) Appl. No.: 11/232,666

(22) Filed: Sep. 22, 2005

(65) Prior Publication Data
US 2006/0060945 A1    Mar. 23, 2006

(30) Foreign Application Priority Data
Sep. 23, 2004   (KR)   ...................... 10-2004-0076612

(51) Int. Cl.
H01L 21/46 (2006.01)
(52) U.S. Cl. ....................... 438/462; 438/401
(58) Field of Classification Search ................. 438/401, 438/462
See application file for complete search history.

(56) References Cited
U.S. PATENT DOCUMENTS
5,475,268 A   12/1995   Kawagoe et al. ............ 257/797

6,395,617 B2 *   5/2002   Ando ........................ 438/401
7,115,994 B2 *   10/2006   Yaegashi ..................... 257/758

FOREIGN PATENT DOCUMENTS

| JP | 07-335721 | 12/1995 |
|---|---|---|
| KR | 1019990084519 | 12/1999 |
| KR | 1020000027785 | 5/2000 |

* cited by examiner

*Primary Examiner*—Jack Chen
(74) *Attorney, Agent, or Firm*—Mills & Onello, LLP

(57) ABSTRACT

In a method of fabricating a semiconductor device having an alignment key and a semiconductor device fabricated thereby. The method of fabricating a semiconductor device includes providing a semiconductor substrate having a scribe lane region and a cell region. An etch barrier pattern and a gate pattern are formed on the scribe lane region and the cell region respectively. A first interlayer insulating layer is formed to cover the etch barrier pattern and the gate pattern. A preliminary alignment key pattern and a bit line pattern are formed on the first interlayer insulating layer of the scribe lane region and the cell region respectively. A second interlayer insulating layer is formed to cover the preliminary alignment key pattern and the bit line pattern. The second interlayer insulating layer and the first interlayer insulating layer are patterned to expose the etch barrier pattern, thereby forming an alignment key pattern in the scribe lane region, and concurrently, forming a storage node contact opening in the cell region.

7 Claims, 12 Drawing Sheets

METHOD OF FABRICATING SEMICONDUCTOR DEVICE HAVING ALIGNMENT KEY AND SEMICONDUCTOR DEVICE FABRICATED THEREBY

CROSS-REFERENCE TO RELATED APPLICATIONS

This application claims priority from Korean Patent Application No. 2004-0076612, filed Sep. 23, 2004, the disclosure of which is incorporated herein by reference in its entirety as if set forth fully herein.

FIELD OF THE INVENTION

The present invention relates to a method of fabricating a semiconductor device having an alignment key and a semiconductor device fabricated thereby, and more particularly, to a method of fabricating a semiconductor device having an alignment key for aligning storage node electrodes, and a semiconductor device fabricated thereby.

BACKGROUND OF THE INVENTION

Photolithography is a vital step in the fabrication of highly-integrated semiconductor devices having a stacked structure. The photolithography process may be performed a number of times during the fabrication of semiconductor devices. During each photolithography step, it is required that a corresponding photomask in each process be aligned precisely with the target semiconductor substrate in order to minimize misalignment between discrete layers. To facilitate the operation, alignment of the photomask and the semiconductor substrate is necessary before performing the photolithography process. An alignment key is provided on a predetermined portion of the semiconductor substrate in order to perform the alignment operation. The alignment key is commonly formed on a scribe lane region between chip dyes in accordance with the fabrication processes. One exemplary approach for forming such an alignment key is disclosed in U.S. Pat. No. 5,475,268.

In the fabrication of a highly-integrated DRAM device, when the width of a bit line is reduced, the distance between storage node contact plugs formed on both sides of the bit line is also reduced. Therefore, when storage node electrodes contacting the storage node contact plugs are formed, it is required that the storage node electrodes be aligned precisely along the width direction of the bit line. In the case that the storage node electrodes are misaligned along the width direction of the bit line, an electrical bridge may occur between the storage node contact plugs provided on both sides of the bit line due to the storage node electrodes. In order to prevent the misalignment of the storage node electrodes, an alignment key (hereinafter, referred to as "bit line key") can be used that is concurrently formed with the bit line during the formation of the bit line, after forming the alignment key on the top of the scribe lane region. More specifically, a molding insulating layer is formed on a resultant structure including the bit line and the storage node electrodes, which are sequentially formed. Then, the molding insulating layer is patterned, thereby forming storage node electrode holes in which the storage node electrodes will be formed. At this time, by aligning a photomask for patterning the insulating layer with the bit line key, misalignment of the storage node electrodes along the width direction of the bit line can be mitigated.

FIGS. 1 to 3 are sectional views illustrating a process of forming an alignment key during the fabrication of a conventional DRAM device. FIGS. 1 to 3 are sectional views illustrating a scribe lane region defined in a semiconductor substrate.

Referring to FIG. 1, a first interlayer insulating layer 3 is formed on a semiconductor substrate 1. The first interlayer insulating layer 3 is also formed in a cell region of the DRAM device (not shown) on which gate patterns are formed. Further, bit line contact pads and storage node contact pads are formed between the gate patterns. Then, a deposition process of forming a conductive layer and a patterning process to form a bit line are performed on the first interlayer insulating layer 3 of the cell region. During the processes, a bit line key pattern 5 is concurrently formed on the first interlayer insulating layer 3 of the scribe lane region.

Referring to FIG. 2, a second interlayer insulating layer 7 is formed to cover the bit line key pattern 5. In the case of using the bit line key pattern 5 as an alignment key to form a storage node electrode hole, the bit line key pattern 5 may be unrecognizable using merely an optical method using the alignment equipment in a stepper due to a molding insulating layer and a hard mask pattern subsequently formed on the second interlayer insulating layer 7 to form the storage node electrode holes. Particularly, the possibility of the misalignment may be further increased when the thickness of the molding insulating layer is increased with the high integration of the DRAM device, and when an amorphous carbon layer having a low light transmittance is used as the hard mask pattern. Therefore, the process of forming the alignment key having an appropriate step height difference is performed by etching the interlayer insulating layers on the scribe lane region together during an anisotropic etch process of forming the storage node contact holes in the cell region. That is, since the bit line key pattern 5 has a high etch selectivity with respect to the interlayer insulating layers 3, 7, an alignment key pattern 9 is formed as shown in FIG. 2. During the process, the first interlayer insulating layer 3 below the bit line key pattern 5 may be etched to expose the semiconductor substrate 1 since the first interlayer insulating layer 3 does not include an etch stop layer. In this case, the step height difference h1 formed by the alignment key pattern 9 may be excessively increased.

Referring to FIG. 3, after the alignment key pattern 9 is formed, a third interlayer insulating layer 11 is formed to cover the scribe lane region having the alignment key pattern 9 formed thereon. A capacitor is formed to have the storage node electrodes inside the third interlayer insulating layer 11 of the cell region. Since the third interlayer insulating layer 11 formed on the alignment key pattern 9 is affected by the step height difference h1 formed by the alignment key pattern 9, a top portion of the third interlayer insulating layer 11 has a global step height difference h2. Therefore, when the step height difference h1 formed by the alignment key pattern 9 becomes excessively large as shown in FIG. 2, the global step height difference h2 is also increased. In this case, because the global step height difference h2 has an influence on a main chip region adjacent to the scribe lane region, the flatness of the third interlayer insulating layer 11 formed on top of the main chip region may be deteriorated. As a result, the difference in height may adversely affect subsequent fabrication processes, for example pattern deterioration can occur during a photolithography process of forming a metal interconnection on the third interlayer insulating layer 11.

SUMMARY OF THE INVENTION

Therefore, the present invention is directed to provide a method of fabricating a semiconductor device for preventing an excessive global step height difference of an insulating layer formed on an alignment key by controlling the shape of the alignment key formed in a scribe lane region of a semiconductor substrate.

In one aspect of the present invention, a method is provided for fabricating a semiconductor device having an alignment key. The method includes providing a semiconductor substrate having a scribe lane region and a cell region. An etch barrier pattern and a gate pattern are formed on the scribe lane region and the cell region respectively. A first interlayer insulating layer is formed to cover the etch barrier pattern and the gate pattern. A preliminary alignment key pattern and a bit line pattern are formed on the first interlayer insulating layer of the scribe lane region and the cell region respectively. A second interlayer insulating layer is formed to cover the preliminary alignment key pattern and the bit line pattern. The second interlayer insulating layer and the first interlayer insulating layer are patterned to expose the etch barrier pattern, thereby forming an alignment key pattern in the scribe lane region, and concurrently, forming a storage node contact opening in the cell region.

In one embodiment, the etch barrier pattern may have a height substantially equal to that of the gate pattern.

In another embodiment, the etch barrier pattern may be formed of at least one material layer having an etch selectivity with respect to the first interlayer insulating layer. In this case, the etch barrier pattern may be formed of a polysilicon layer, or a stack layer including a polysilicon layer and a silicon nitride layer.

In another embodiment, the preliminary alignment key pattern may be formed of a conductive layer pattern having an etch selectivity with respect to the first interlayer insulating layer and the second interlayer insulating layer. In this case, the conductive layer pattern may be a tungsten layer pattern, a titanium nitride layer pattern, or a polysilicon layer pattern.

In another embodiment, the preliminary alignment key pattern may further include an insulating layer pattern covering the sidewalls and the upper surface of the conductive layer pattern. In this case, the insulating layer pattern may be formed of a material layer having an etch selectivity with respect to the first interlayer insulating layer and the second interlayer insulating layer.

In another aspect, the present invention provides a method of fabricating a semiconductor device having an alignment key. The method includes providing a semiconductor substrate having a scribe lane region and a cell region. A gate pattern is formed on the cell region. A lower interlayer insulating layer is formed on the semiconductor substrate to cover the gate pattern. A first interlayer insulating layer is formed on the lower interlayer insulating layer. A preliminary alignment key pattern and a bit line pattern are formed on the first interlayer insulating layer of the scribe lane region and the cell region respectively. A second interlayer insulating layer is formed to cover the preliminary alignment key pattern and the bit line pattern. The second interlayer insulating layer, the first interlayer insulating layer and the lower interlayer insulating layer are patterned, thereby forming an alignment key trench having a predetermined width by the preliminary alignment key pattern in the scribe lane region, and concurrently, forming a storage node contact opening in the cell region.

In one embodiment, the preliminary alignment key pattern is formed of a conductive layer pattern having an etch selectivity with respect to the first interlayer insulating layer, the second interlayer insulating layer, and the lower interlayer insulating layer.

In another embodiment, the conductive layer pattern is a tungsten layer pattern, a titanium nitride layer pattern, or a polysilicon layer pattern.

In another embodiment, the preliminary alignment key pattern further comprises an insulating layer pattern covering sidewalls and an upper surface of the conductive layer pattern, and the insulating layer pattern is formed of a material layer having an etch selectivity with respect to the first interlayer insulating layer, the second interlayer insulating layer, and the lower interlayer insulating layer.

In another embodiment, the insulating layer pattern is formed of a silicon nitride layer.

In another embodiment, the alignment key trench is formed to expose the semiconductor substrate.

In another embodiment, the alignment key trench may be formed to have a width of about 2 to 3 μm.

In another aspect of the present invention, the present invention provides a semiconductor device having an alignment key. The semiconductor device includes a semiconductor substrate having a scribe lane region and a cell region. An etch barrier pattern is disposed on the scribe lane region. An interlayer insulating layer is disposed on the etch barrier pattern and exposes a predetermined portion of the etch barrier pattern to define an alignment key region. An alignment key pattern is disposed on the etch barrier pattern of the alignment key region to have a mesa structure, and has an interlayer insulating layer pattern and a preliminary alignment key pattern, which are sequentially stacked.

In one embodiment, the etch barrier pattern may be at least one material layer having an etch selectivity with respect to the interlayer insulating layer. In this case, the etch barrier pattern may be a polysilicon layer, or a stack layer including a polysilicon layer and a silicon nitride layer.

In another embodiment, the preliminary alignment key pattern may be formed by the same process as that of forming a bit line pattern formed on the interlayer insulating layer of the cell region.

In another embodiment, the preliminary alignment key pattern may include a conductive layer pattern having an etch selectivity with respect to the interlayer insulating layer. In this case, the conductive layer pattern may be a tungsten layer pattern, a titanium nitride layer pattern, or a polysilicon layer pattern.

In another embodiment, the preliminary alignment key pattern may further include an insulating layer pattern covering the sidewalls and the upper surface of the conductive layer pattern. In this case, the insulating layer pattern may be a material layer having an etch selectivity with respect to the first interlayer insulating layer and the second interlayer insulating layer.

In another aspect, the present invention provides a semiconductor device having an alignment key. The semiconductor device includes a semiconductor substrate having a scribe lane region and a cell region. An interlayer insulating layer is disposed on the scribe lane region. A preliminary alignment key pattern is disposed on the interlayer insulating layer to define an upper trench exposing the interlayer insulating layer. A lower trench is formed to extend from the upper trench into the interlayer insulating layer, and constitutes an alignment key trench together with the upper trench.

In one embodiment, the preliminary alignment key pattern is formed by the same process as that of forming a bit line pattern formed on the interlayer insulating layer of the cell region.

In another embodiment, the preliminary alignment key pattern includes a conductive layer pattern having an etch selectivity with respect to the interlayer insulating layer.

In another embodiment, the conductive layer pattern is a tungsten layer pattern, a titanium nitride layer pattern, or a polysilicon layer pattern.

In another embodiment, the preliminary alignment key pattern further comprises an insulating layer pattern covering sidewalls and an upper surface of the conductive layer pattern, and the insulating layer pattern is a material layer having an etch selectivity with respect to the interlayer insulating layer.

In another embodiment, the insulating layer pattern is a silicon nitride layer.

In another embodiment, the alignment key trench may have a width of about 2 to 3 μm.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
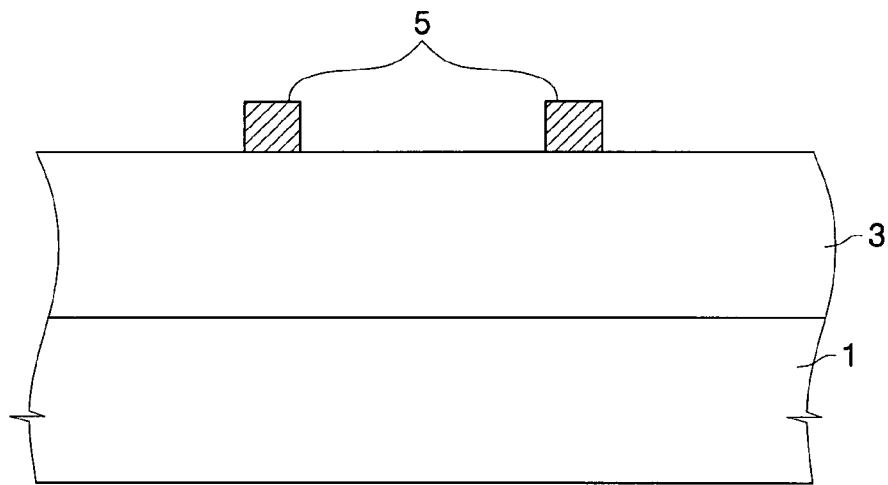
FIGS. 1 to 3 are sectional views illustrating a process of forming an alignment key during the fabrication of a conventional DRAM device.
Figure 2:
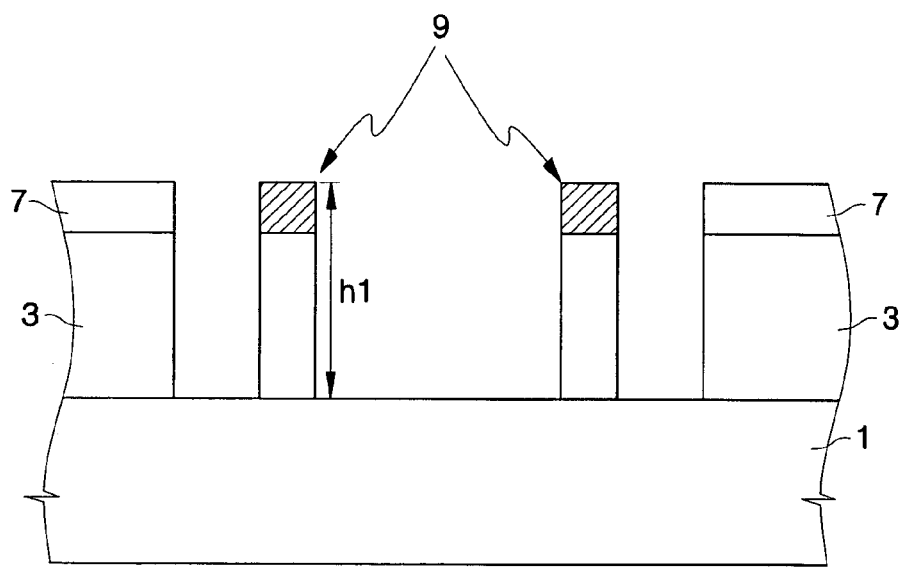
Figure 3:
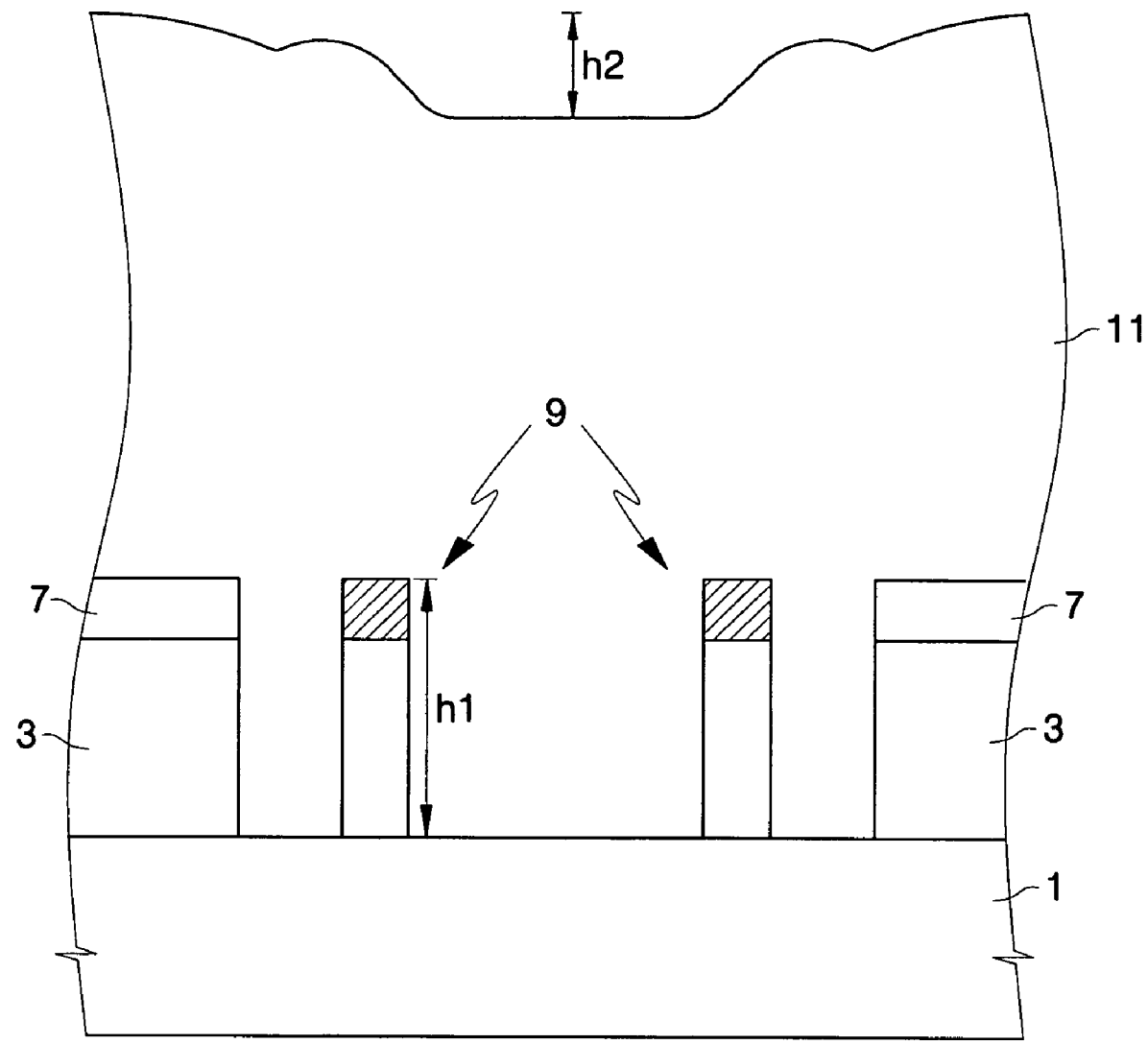

The present invention will now be described more fully hereinafter with reference to the accompanying drawings, in which preferred embodiments of the invention are shown. This invention may, however, be embodied in many different forms and should not be construed as being limited to the embodiments set forth herein. In the drawings, the thicknesses of layers and regions are exaggerated for clarity. Like numbers refer to like elements throughout the specification.

FIGS. 4 to 9 are sectional views illustrating a method of fabricating a semiconductor device having an alignment key according to an embodiment of the present invention. In FIGS. 4 to 9, a region indicated by a reference letter "A" represents a cell region of a main chip region, and a region indicated by a reference letter "B" represents a scribe lane region.

Figure 4:
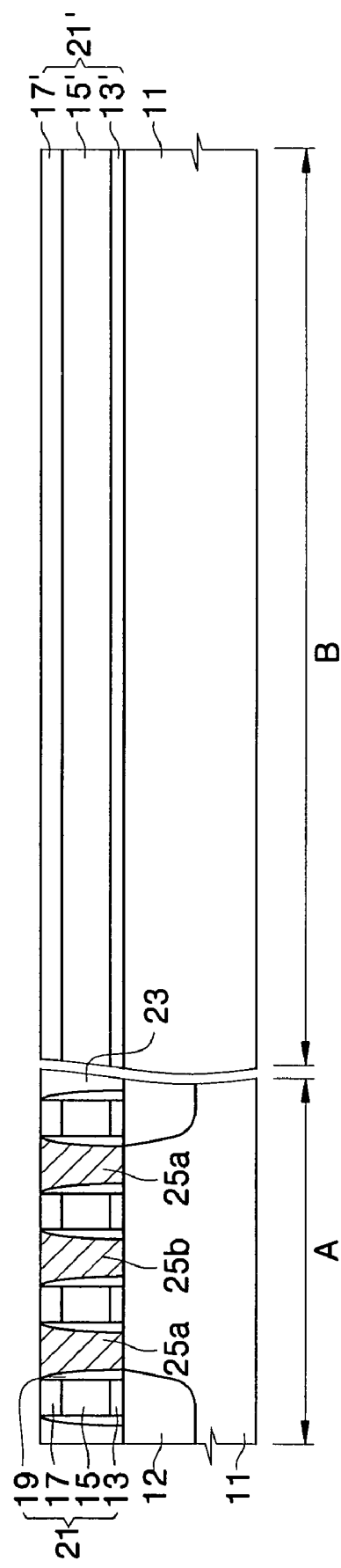
FIGS. 4 to 9 are sectional views illustrating a method of fabricating a semiconductor device having an alignment key according to an embodiment of the present invention.

Referring to FIG. 4, an isolation layer 12 defining an active region is formed in a semiconductor substrate 11 of the cell region A. The isolation layer 12 may be formed using a typical shallow trench isolation process. A gate oxide layer, a gate conductive layer, and a gate capping layer are sequentially formed on the overall surface of the semiconductor substrate 11 having the isolation layer 12. The gate oxide layer may be formed of a thermal oxide layer, and the gate conductive layer may be formed of a polysilicon layer. Further, the gate capping layer may be formed of a silicon nitride layer. Then, the gate capping layer, the gate conductive layer, and the gate oxide layer formed on the cell region A are sequentially patterned, thereby forming gate patterns 21 running across over the active region. In this case, each of the gate patterns 21 includes a gate oxide layer 13, a gate conductive layer pattern 15, and a gate capping layer pattern 17, which are sequentially stacked. Each of the gate patterns 21 may further include gate spacers 19 covering the sidewalls thereof. In the meantime, during an anisotropic etch process for patterning the gate patterns 21, the scribe lane region B is protected by a mask pattern such as a photoresist pattern. As a result, an etch barrier pattern 21' is formed on the scribe lane region B as shown in FIG. 4. The etch barrier pattern 21' is formed during the same formation process as that of the gate patterns 21, and is formed of the same material layer as that of the gate patterns 21. Thus, the etch barrier pattern 21' has a height equal to those of the gate patterns 21, and includes the same material layers as those of the gate patterns 21. That is, the etch barrier pattern 21' also includes a lower layer 15' and an upper layer 17' formed on the thermal oxide layer 13'. In this case, the lower layer 15' is formed of a polysilicon layer, the same material layer as that of the gate conductive layer pattern 15, and the upper layer 17' may be formed of a silicon nitride layer, the same material layer as that of the gate capping layer pattern 17.

Then, a lower interlayer insulating layer 23 is formed on the overall surface of the semiconductor substrate 11 having the gate patterns 21 and the etch barrier pattern 21'. Then, conductive pads 25a, 25b are formed between the gate patterns 21 using a typical self-align contact technology. The lower interlayer insulating layer 23 may be formed of a silicon oxide layer such as a high density plasma (HDP) oxide layer, a borophospho silicate (BPSG) layer, or the like, having an excellent gap-filling characteristic. The conductive pads include a bit line contact pad 25b and storage node contact pads 25a. During the process, the lower interlayer insulating layer 23 on the etch barrier pattern 21' may remain with a predetermined thickness depending on an extent of polishing during a chemical mechanical polishing (CMP) process to form the conductive pads 25a, 25b, or may be entirely removed from the upper surface of the upper layer 17' as shown in FIG. 4.

Figure 5:
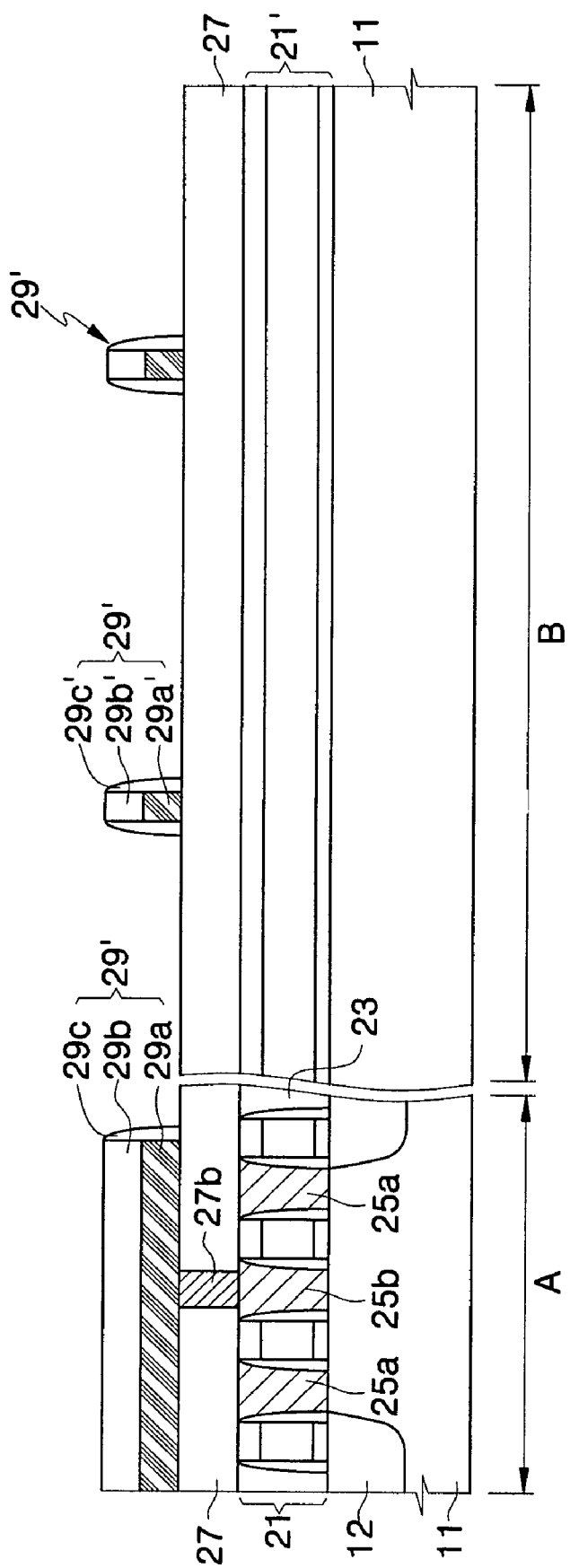

Referring to FIG. 5, a first interlayer insulating layer 27 is formed on the overall surface of the semiconductor substrate 11 including the conductive pads 25a, 25b. The first interlayer insulating layer 27 may be formed of a silicon oxide layer. Then, a bit line contact plug 27b, which is electrically connected to the bit line contact pad 25b, is formed in the first interlayer insulating layer 27 in the cell region A. Then, a bit line conductive layer and a bit line capping layer are sequentially formed on the overall surface of the first interlayer insulating layer 27. The bit line conductive layer may be formed of a tungsten layer, a titanium nitride layer, or a polysilicon layer. Further, the bit line capping layer may be formed of a silicon nitride layer. Then, a photolithography process and an etch process are performed to sequentially pattern the bit line conductive layer and the bit line capping layer, thereby forming a bit line 29a and a bit line capping layer pattern 29b in the cell region A, which are electrically connected to the bit line contact plug 27b. Then, a spacer formation process using a silicon nitride layer is performed, thereby bit line spacers 29c covering the sidewalls of the bit line 29a and the capping layer pattern 29b. The bit line 29a, the bit line capping layer pattern 29b, and the bit line spacer 29c constitute a bit line pattern 29. The bit line pattern 29 is formed in a direction across the gate patterns 21.

In the meantime, a preliminary alignment key pattern 29' is formed on the etch barrier pattern 21' of the scribe lane region B at the same time the bit line pattern 29 is formed. That is, the preliminary alignment key pattern 29' includes a conductive layer pattern 29a' and an insulating capping layer pattern 29b' covering the upper surface of the conductive layer pattern 29a'. Further, the preliminary alignment key pattern 29' may further include insulating spacers 29c' covering the sidewalls of the conductive layer pattern 29a' and the insulating capping layer pattern 29b'. In this case, the conductive layer pattern 29a' is formed of the same material layer as that of the bit line 29a, and the insulating capping layer pattern 29b' is formed of the same material layer as that of the bit line capping layer pattern 29b. Further, the insulating spacers 29c' are also formed of the same material layer as that of the bit line spacers 29.

Figure 6:
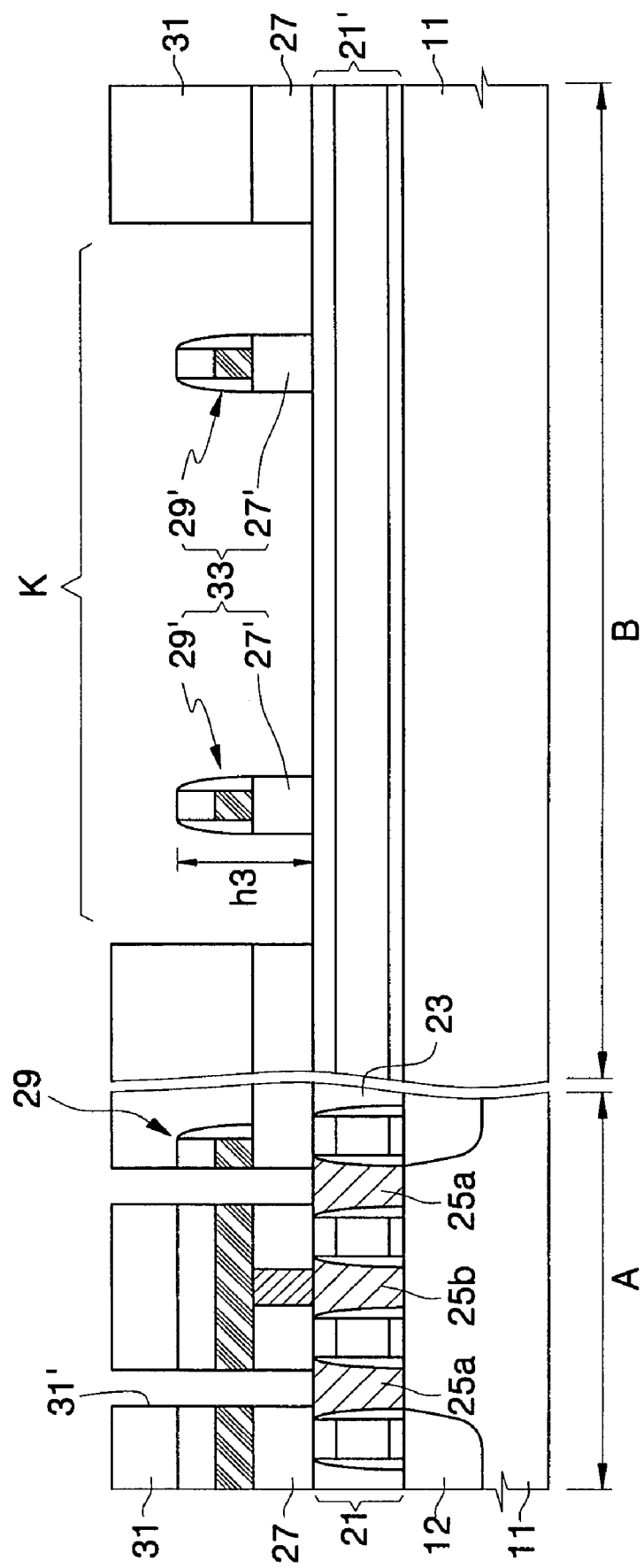

Referring to FIG. 6, a second interlayer insulating layer 31 is formed on the overall surface of the semiconductor substrate 11 having the bit line pattern 29 and the preliminary alignment key pattern 29'. The second interlayer insulating layer 31 may be formed of a silicon oxide layer such as a HDP oxide layer, a BPSG layer, or the like having an excellent gap-filling characteristic. Then, a photolithography process and an anisotropic etch process are performed to pattern the second interlayer insulating layer 31 and the first interlayer insulating layer 27, thereby forming storage node contact openings 31' exposing the storage node electrode pads 25a. The storage node contact openings 31' may be formed as a hole shape corresponding to the storage node electrode pads 25a respectively. On the contrary, the storage node contact openings 31' may be formed as a line shape running across the bit line pattern 29. In this case, process margin during the photolithography process is further improved as compared to the case where the storage node contact openings 31' are formed as a hole shape, and thus, the storage node contact openings 31' can be more readily formed.

In the meantime, the second interlayer insulating layer 31 and the first interlayer insulating layer 27 of the scribe lane region B are patterned together while the storage node contact openings 31' are formed in the cell region A. That is, a mask pattern for defining an alignment key region K, for example, a photoresist pattern, is formed on the second interlayer insulating layer 31 of the scribe lane region B during the photolithography process of forming the storage node contact openings 31'. Then, the second interlayer insulating layer 31 and the first interlayer insulating layer 27 in the scribe lane region B are etched together using the mask pattern as an etch mask during the etch process of forming the storage node contact openings 31'. As a result, an alignment key pattern 33 having a mesa structure is formed in the scribe lane region B. That is, the preliminary alignment key pattern 29' is formed of a material layer having an etch selectivity with respect to the first interlayer insulating layer 27 and the second interlayer insulating layer 31. Thus, the portion of the first interlayer insulating layer 27 protected by the preliminary alignment key pattern 29' is remained as a first interlayer insulating layer pattern 27'. Further, since at least a top layer of the etch barrier pattern 21' is formed of a material layer having an etch selectivity with respect to the first interlayer insulating layer 27, which is formed of a silicon oxide layer as described above, the etch barrier pattern 21' functions as an etch stop layer.

According to an embodiment of the present invention, the etch barrier pattern 21' of the scribe lane region B is formed at the same time the gate pattern 21 is formed in the cell region A. Since the gate pattern 21 is formed of a material layer having an etch selectivity with respect to a silicon oxide layer, which is normally used for an interlayer insulating layer, the etch barrier pattern 21' is also formed of a material layer having an etch selectivity with respect to a silicon oxide layer. As a result, a step height difference h3 of the alignment key pattern 29' is not excessively increased.

Figure 7:
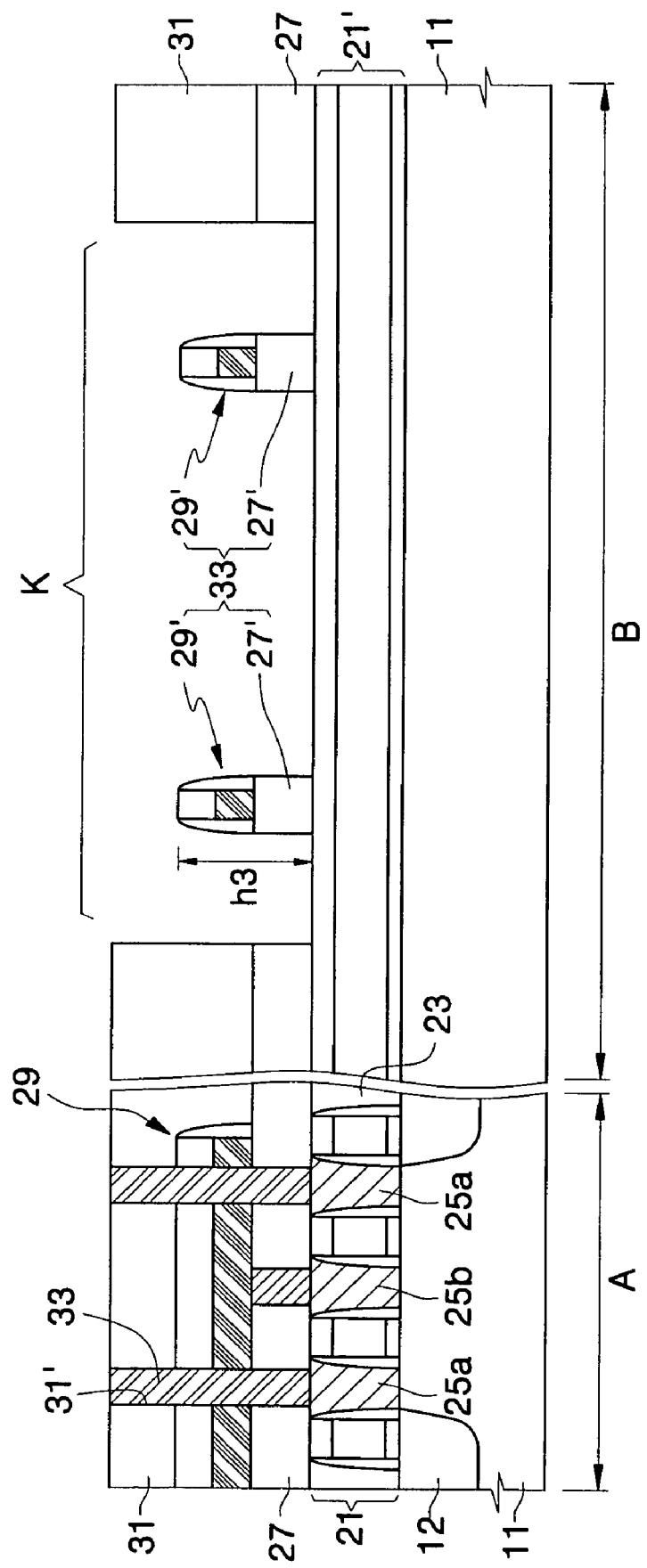

Referring to FIG. 7, a conductive layer such as polysilicon is formed on the overall surface of the semiconductor substrate having the storage node contact openings 31' and the alignment key pattern 33, and the conductive layer is formed to fill the storage node contact openings 31'. Then, the conductive layer is planarized until the second interlayer insulating layer 31 is exposed, thereby forming storage node contact plugs 33 inside the storage node contact openings 31'. The conductive layer may be planarized using a CMP process. In the meantime, even though not shown in the drawing, the conductive layer may be also formed on the scribe lane region B conformably with a thin thickness.

Alternatively, in the case that the storage node contact openings 31' are formed to have a linear shape that runs across the bit line pattern 29 as described above, the planarization process may be performed until the bit line capping layer 29b is exposed.

Figure 8:
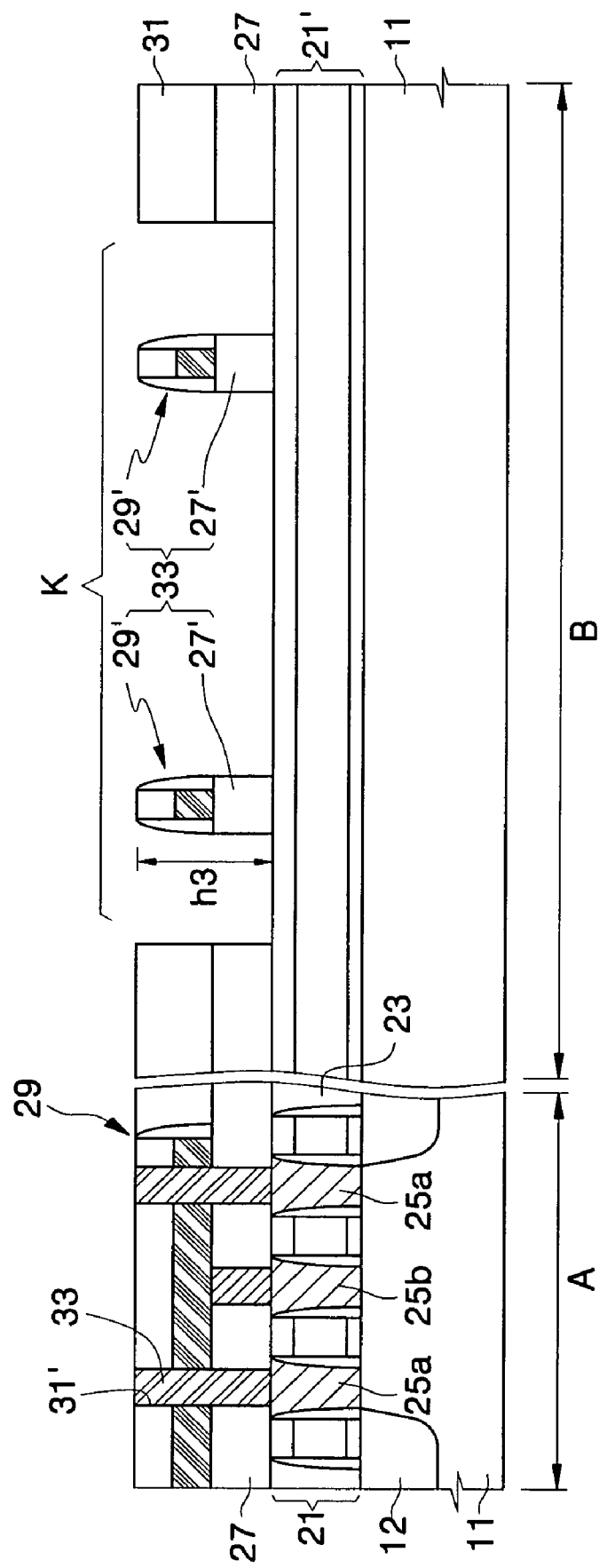

Referring to FIG. 8, after the conductive layer filling the storage node contact openings 31' is formed as shown in FIG. 6, the conductive layer and the second interlayer insulating layer 31 are planarized until the bit line capping layer 29b is exposed. The conductive layer and the second interlayer insulating layer 31 may be planarized by a CMP process or by an overall-surface anisotropic etch process. As a result, the conductive layers filling the storage node contact openings 31' having a line shape are electrically separated by the bit line pattern 29 so that storage node contact plugs 31' contacting the storage node contact pads 25a respectively are formed. During the process, the second interlayer insulating layer 31 of the scribe lane region B is also planarized so that its thickness is reduced.

Figure 9:
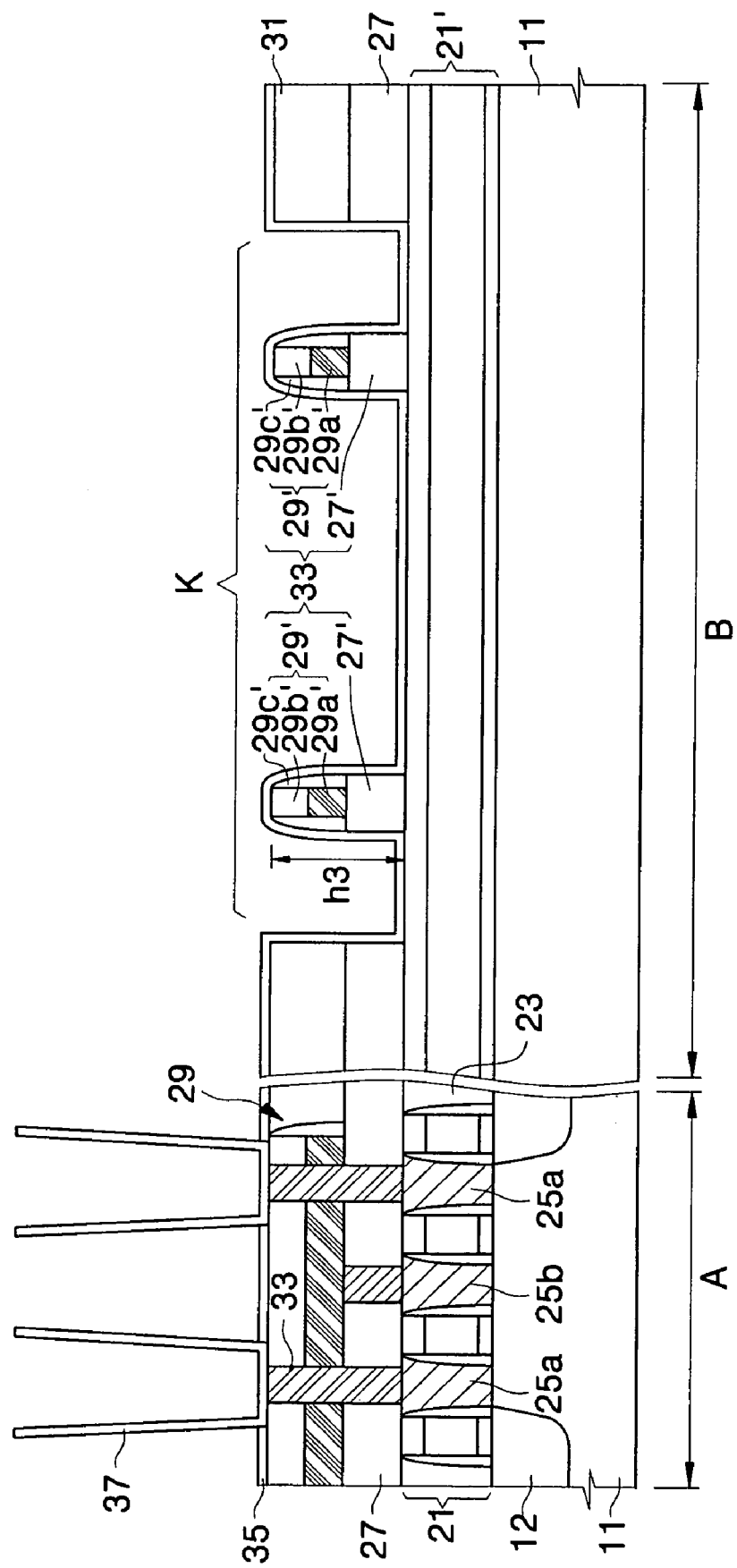

Referring to FIG. 9, an etch stop layer 35 is formed on the overall surface of the semiconductor substrate having the storage node contact plugs 33. In one example, the etch stop layer 35 is formed of a silicon nitride layer. Following this, storage node electrodes 37 are formed to be electrically connected with the storage node contact plugs 33 in accordance with customary fabrication procedures. That is, a molding insulating layer (not shown) is formed on the etch stop layer 35, and a photolithography process and an etch process are performed to pattern the molding insulating layer, thereby forming storage node electrode holes where the storage node electrodes 37 are to be formed. During the photolithography process of patterning the molding insulating layer, the alignment key pattern 33 is used to align the semiconductor substrate and the photomask. As a result, the storage node electrodes to be formed inside the storage node electrode holes can be accurately aligned along the width direction of the bit line pattern 29. The molding insulating layer is removed using the process such as a wet etch process after the storage node electrodes 37 are formed.

Then, a capacitor is formed by performing typical formation processes, and an upper interlayer insulating layer covering the capacitor is formed on the overall surface of the semiconductor substrate. According to an embodiment of the present invention, an excessively large step height difference of the alignment key pattern 33 is prevented by the presence of the etch barrier pattern 21'. Further, the step height difference of the upper interlayer insulating layer can be also reduced. Therefore, subsequent processes such as a metallization process can be performed more stably.

Now hereinafter, a semiconductor device having an alignment key according to an embodiment of the present invention will be described in reference to FIG. 9.

Referring to FIG. 9, a cell region A and a scribe lane region B are defined in a semiconductor substrate 11. An etch barrier pattern 21' is provided on the scribe lane region B. The etch barrier pattern 21' may be formed of at least one material layer having an etch selectivity with respect to interlayer insulating layers to be formed on the etch barrier pattern 21'. In this case, the etch barrier pattern 21' may be formed of a polysilicon layer, or a stacked layer including a polysilicon layer and a silicon nitride layer. The etch barrier pattern 21' may be formed through the same photolithography process and the etch process as those of forming gate patterns 21 provided on the cell region A, at the same level as that of the gate pattern 21 on the semiconductor substrate 11.

An interlayer insulating layer is provided on the etch barrier pattern 21' while exposing a predetermined portion of the etch barrier pattern 21'. The interlayer insulating layer may include a first interlayer insulating layer 27 and a second interlayer insulating layer 31, which are sequentially stacked on the etch barrier pattern 21'. The first interlayer insulating layer 27 and the second interlayer insulating layer 31 may be silicon oxide layers. The portion exposed by the first interlayer insulating layer 27 and the second interlayer insulating layer 31 is provided as an alignment key region K. An alignment key pattern 33 having a mesa structure is disposed on the etch barrier pattern 21' of the alignment key region K. The alignment key pattern 33 includes a first interlayer insulating layer pattern 27' and a preliminary alignment key pattern 29', which are sequentially stacked on the etch barrier pattern 21'.

The preliminary alignment key pattern 29' is formed during the same process as the process of forming the bit line pattern 29 formed on the second interlayer insulating layer 31 of the cell region A. The preliminary alignment key pattern 29' includes a conductive layer pattern 29a' having an etch selectivity with respect to the interlayer insulating layer. Further, the preliminary alignment key pattern 29' may include an insulating capping layer pattern 29b' covering an upper surface of the conductive layer pattern 29a', and insulating spacers 29c' covering the sidewalls of the conductive layer pattern 29a' and the insulating capping layer pattern 29b'. In this case, the conductive layer pattern 29a' may be a tungsten layer pattern, a titanium nitride layer pattern, or a polysilicon layer pattern. Further, the insulating capping layer pattern 29b' and the insulating spacers 29c' may be formed of a material layer having an etch selectivity with respect to the interlayer insulating layer, such as a silicon nitride layer.

The alignment key pattern 33 is provided as an alignment key for aligning storage node electrode holes along the width direction of the bit line pattern 29 during the formation of storage node electrodes, in specific, during a photolithography process of forming the storage node electrode holes in which the storage node electrodes will be formed.

FIGS. 10 to 13 are sectional views illustrating a method of fabricating a semiconductor device having an alignment key according to another embodiment of the present invention. In FIGS. 10 to 13, a region indicated by a reference letter "A" represents a cell region of a main chip region, and a region indicated by a reference letter "B" represents a scribe lane region.

Figure 10:
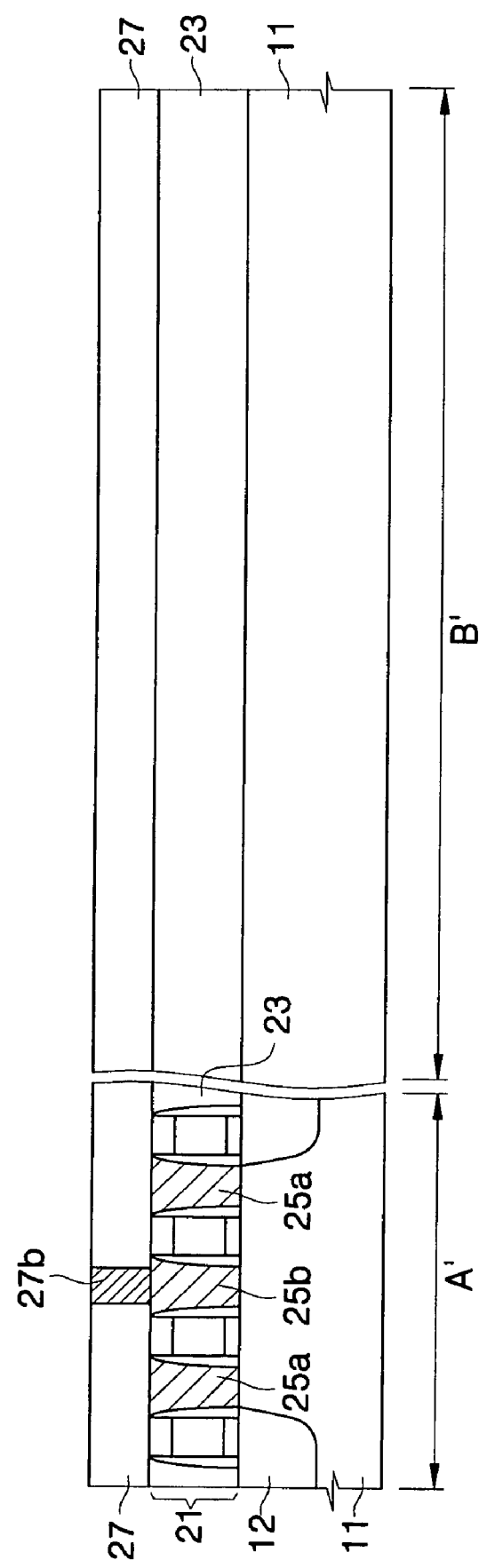
FIGS. 10 to 13 are sectional views illustrating a method of fabricating a semiconductor device having an alignment key according to another embodiment of the present invention.

Referring to FIG. 10, an isolation layer 12 for defining an active region is formed in the semiconductor substrate 11 of the cell region A'. A gate oxide layer, a gate conductive layer, and a gate capping layer are sequentially formed on the overall surface of the semiconductor substrate 11 having the isolation layer 12. Then, the gate capping layer, the gate conductive layer, and the gate oxide layer are sequentially patterned using the photolithography process and the etch process, thereby forming gate patterns 21 running across over the active region. The gate capping layer and the gate conductive layer formed on the scribe lane region B' are removed during the etch process. Further, the gate oxide layer may be also removed. In this case, the surface of the semiconductor substrate 11 of the scribe lane region B' can be exposed. Then, a lower interlayer insulating layer 23 is formed on the overall surface of the semiconductor substrate 11 having the gate patterns 21. The lower interlayer insulating layer 23 may be formed of a silicon oxide layer having a gap-filling characteristic such as a high density plasma (HDP) oxide layer, a borophospho silicate (BPSG) layer, or the like. Then, conductive pads 25a, 25b are formed between the gate patterns 21 using a typical self-align contact technology. The conductive pads include a bit line contact pad 25b and storage node contact pads 25a. In the meantime, FIG. 10 illustrates that the thickness of the lower interlayer insulating layer 23 formed on the scribe lane region B' is equal to the height of the gate patterns 21. However, the lower interlayer insulating layer 23 may be formed with different thicknesses in the cell region A' and the scribe lane region B' respectively due to the gate patterns 21 formed accurately on the cell region A'. That is, the lower interlayer insulating layer 23 may be formed with a smaller thickness on the scribe lane region B' than that on the cell region A'. Therefore, layers to be formed on the lower interlayer insulating layer 23 during subsequent processes may be disposed on the scribe lane region B' at a level lower than that of the cell region A'.

Then, a first interlayer insulating layer 27 is formed on the overall surface of the semiconductor substrate 11 having the conductive pads 25a, 25b. Then, a bit line contact plug 27b, which is electrically connected with the bit line contact pad 25b, is formed in the first interlayer insulating layer 27 of the cell region A'.

Figure 11:
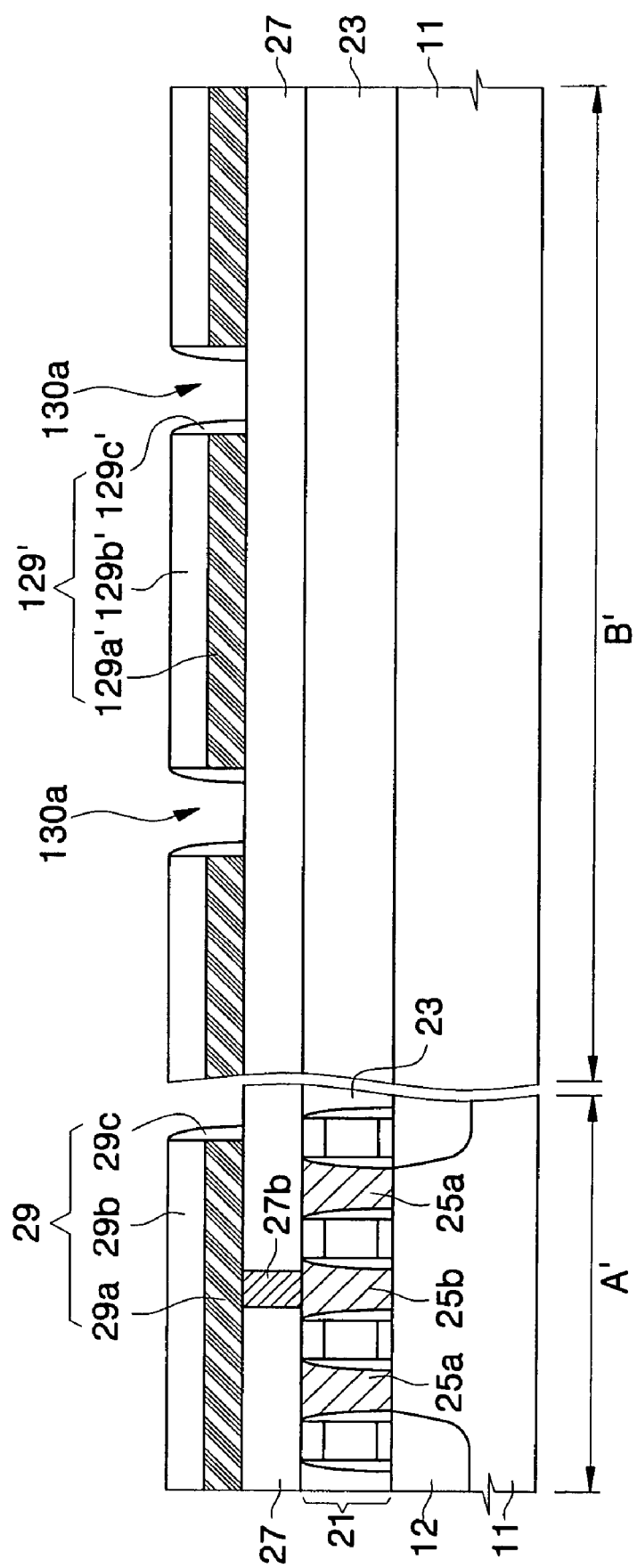

Referring to FIG. 11, a bit line conductive layer and a bit line capping layer are sequentially formed on the overall surface of the first interlayer insulating layer 27. Then, the processes described above in reference to FIG. 5 are performed, thereby forming bit line patterns 29, which are electrically connected with the bit line contact plug 27b, on the first interlayer insulating layer 27 of the cell region A'. In the meantime, while the bit line patterns 29 are formed, preliminary alignment key patterns 129' are formed on the etch barrier pattern 21' of the scribe lane region B by the same process. At this time, upper trenches 130a for exposing predetermined portions of the first interlayer insulating layer 27 respectively are defined by the preliminary alignment key patterns 129'.

Figure 12:
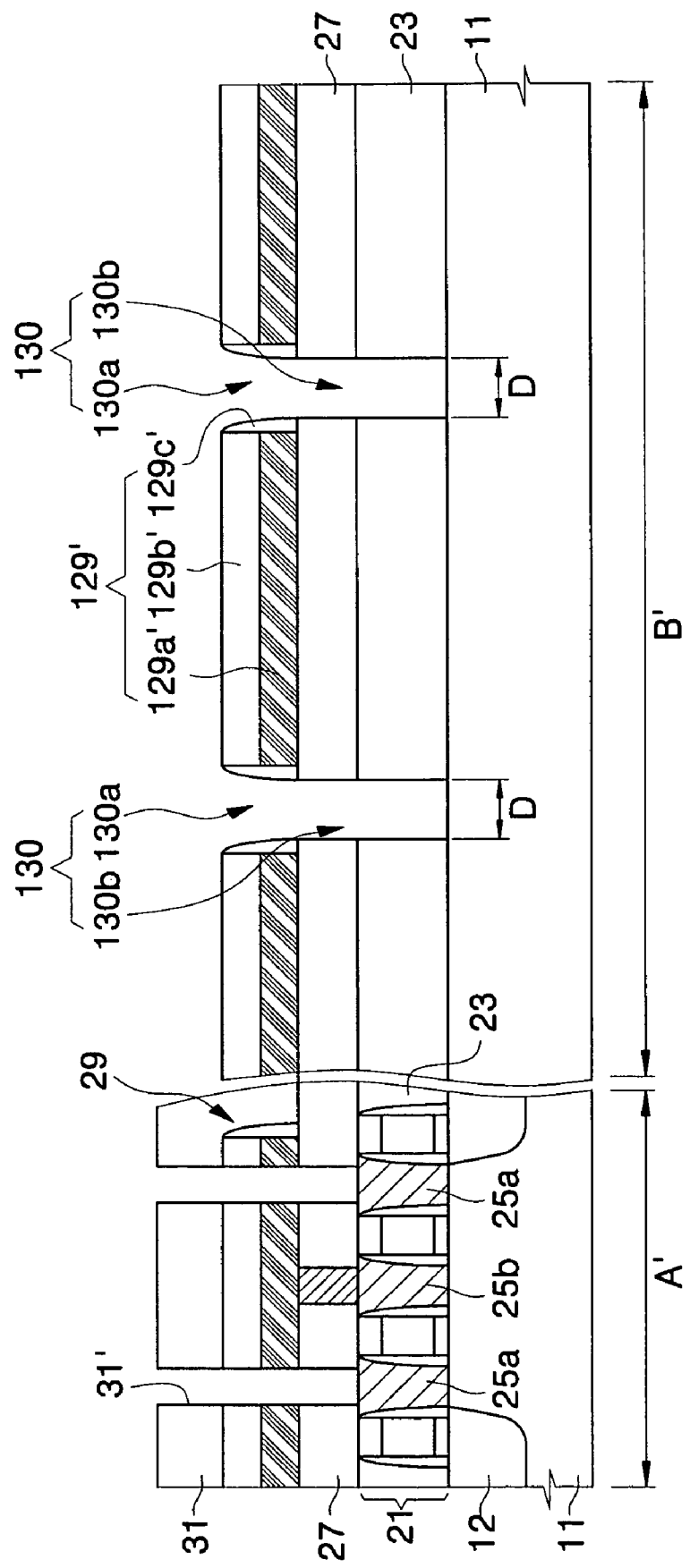

Referring to FIG. 12, a second interlayer insulating layer 31 is formed on the overall surface of the semiconductor substrate 11 having the bit line patterns 29 and the preliminary alignment key patterns 129'. Then, a photolithography process and an etch process are performed to pattern the second interlayer insulating layer 31 and the first interlayer insulating layer 27, thereby forming storage node contact openings 31'exposing the storage node contact pads 25a. As described above, the storage node contact openings 31' may be formed as a hole shape, or may be formed as a line shape running in a direction across the bit line patterns 29.

During the process, the scribe lane region B' is exposed to the environment of the etch process without the use of a mask pattern. As a result, the second interlayer insulating layer 31 formed on the scribe lane region B' is removed, and the first interlayer insulating layer 27 and the lower interlayer insulating layer 23 are also etched. The material layers to form the bit line patterns 29 are normally formed of material layers having an etch selectivity with respect to a silicon oxide layer used for an interlayer insulating layer. Thus, the preliminary alignment key patterns 129' formed concurrently with the bit line patterns 29 also have an etch selectivity with respect to the interlayer insulating layers. Thus, the preliminary alignment key patterns 129' formed on the second interlayer insulating layer 31 function as an etch mask. As a result, lower trenches 130b are formed inside the first interlayer insulating layer 27 and the lower interlayer insulating layer 23 to be aligned with the upper trenches 130a. The lower trenches 130b and the upper trenches 130a constitute alignment key trenches 130. In the meantime, an etch stop layer does not exist inside the lower interlayer insulating layer 23 and the first interlayer insulating layer 27. Thus, the lower trenches 130b can be formed to expose the semiconductor substrate 11 as shown in FIG. 12.

Figure 13:
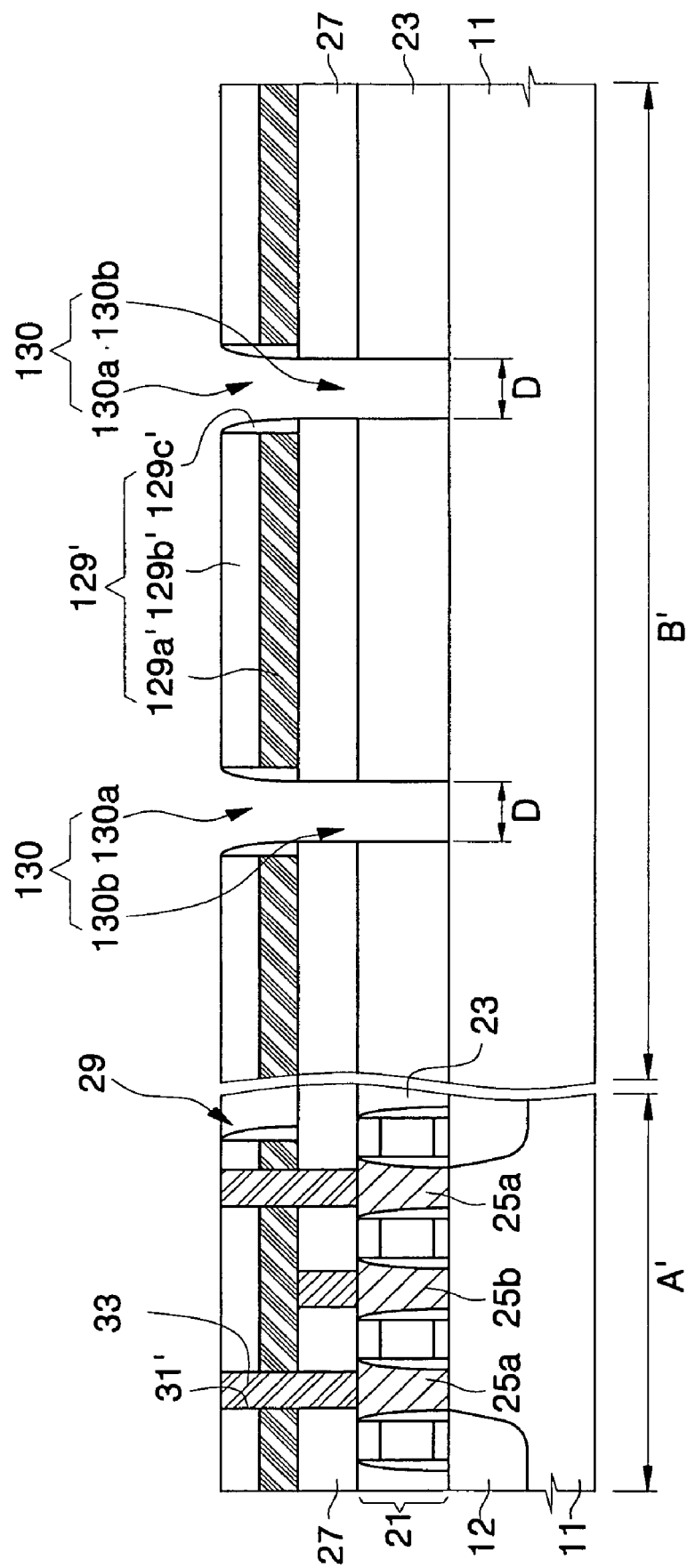

The width D of the alignment key trenches 130 may be determined by considering the thickness of a molding insulating layer to be formed on the scribe lane region B having the alignment key trenches 130 during a subsequent process of forming storage node contact holes. That is, a sufficient step height difference is necessary to form on the upper surface of the molding insulating layer for an alignment process. Further, the width D of the alignment key trenches 130 is preferably controlled so as not to result in an excessive step height difference on an upper interlayer insulating layer to be formed on the semiconductor substrate on which a metal interconnection will be formed following the process of forming a capacitor. The width D of the alignment key trenches 130 may be determined during the photolithography process of forming the preliminary alignment key patterns 129'. In one embodiment of the present invention, each of the alignment key trenches 130 preferably has a width D of about 2 to 3 μm. After the storage node contact openings 31' and the alignment key trenches 130 are formed, a conductive layer filling the storage node contact openings 31', for example, a polysilicon layer, is formed. Then, the conductive layer is planarized to expose the second interlayer insulating layer 31, thereby forming storage node contact plugs 33 inside the storage node contact openings 31'. In the meantime, in the case that the storage node contact openings 31' have a line shape, the planarization process may be performed to expose the bit line pattern 29 for the electrical separation between the storage node contact plugs 33 as shown in FIG. 13. Then, processes of forming storage node electrodes in the cell region A' may be performed as explained above in reference to FIG. 9.

Hereinafter, a semiconductor device having an alignment key according to another embodiment of the present invention will be described in reference to FIG. 13.

Referring to FIG. 13, a cell region A' and a scribe lane region B' are defined in a semiconductor substrate 11. An interlayer insulating layer is disposed on the semiconductor substrate 11 of the cell region A' and the scribe lane region B'. The interlayer insulating layer includes a lower interlayer insulating layer 23 and a first interlayer insulating layer 27 which are sequentially stacked on the semiconductor substrate 11. Gate patterns 21 are provided on the lower interlayer insulating layer 23 of the cell region A'. Further, conductive pads 25a, 25b are disposed between the gate patterns 21 using a typical self-align contact technology. The conductive pads 25a, 25b include bit line contact pad 25b and storage node contact pads 25a. A bit line contact plug 27b, which is electrically connected with the bit line contact pad 25b, is disposed inside the first interlayer insulating layer 27 of the cell region A'.

Preliminary alignment key patterns 129' for defining upper trenches 130a are provided on the first interlayer insulating layer 27 of the scribe lane region B'. Each of the preliminary alignment key patterns 129' has a predetermined width, and includes a conductive layer pattern 129a' having an etch selectivity with respect to the lower interlayer insulating layer 23 and the first interlayer insulating layer 27. Further, the preliminary alignment key patterns 129' includes an insulating capping layer pattern 129b' covering the upper surface of the conductive layer pattern 129a, and insulating spacers 129c' covering the sidewalls of the conductive layer pattern 129a' and the insulating capping layer pattern 129b'. In this case, the conductive layer pattern 129a' may be a tungsten layer pattern, a titanium nitride layer pattern or a polysilicon layer pattern. Further, the insulating capping layer pattern 129b' and the insulating spacers 129c' may be formed of a material layer having an etch selectivity with respect to the lower interlayer insulating layer 23 and the first interlayer insulating layer 27, for example, a silicon nitride layer. In the meantime, a bit line pattern 29, which is electrically connected with the bit line contact plug 27b, is disposed on the first interlayer insulating layer 27 of the cell region A'. The bit line pattern 29 may be disposed, in one example, in a direction running across the gate patterns 21. The preliminary alignment key patterns 129' and the bit line pattern 29 are formed of the same material layer during the same formation process.

Lower trenches 130b are disposed to extend from the upper trenches 130a inside the first interlayer insulating layer 27 and the lower interlayer insulating layer 23. The lower trenches 130b and the upper trenches 130a constitute alignment key trenches 130. The alignment key trenches 130 may expose the semiconductor substrate 11 as shown in FIG. 13. Each of the alignment key trenches 130 preferably has a width of about 2 to 3 μm. The alignment key trenches 130 are provided as an alignment key for aligning storage node electrode holes along the width direction of the bit line pattern 29 during a process of forming storage node electrodes, in specific, during a photolithography process of forming the storage node electrode holes in which 20 the storage node electrodes will be formed.

As described above, according to the present invention, the step height difference or the shape of the alignment key formed on the scribe lane region of the semiconductor substrate can be controlled, thereby preventing an excessive global step height difference on the insulating layer formed on top of the alignment key.

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

What is claimed is:

1. A method of fabricating a semiconductor device comprising:

providing a semiconductor substrate having a scribe lane region and a cell region;

forming a gate pattern on the cell region;

forming a lower interlayer insulating layer covering the gate pattern on the semiconductor substrate;

forming a first interlayer insulating layer on the lower interlayer insulating layer;

forming a preliminary alignment key pattern and a bit line pattern on the first interlayer insulating layer of the scribe lane region and the cell region respectively;

forming a second interlayer insulating layer to cover the preliminary alignment key pattern and the bit line pattern; and patterning the second interlayer insulating layer, the first interlayer insulating layer and the lower interlayer insulating layer, thereby forming an alignment key trench having a predetermined width by the preliminary alignment key pattern in the scribe lane region, and concurrently, forming a storage node contact opening in the cell region.

2. The method according to claim 1, wherein the preliminary alignment key pattern is formed of a conductive layer pattern having an etch selectivity with respect to the first interlayer insulating layer, the second interlayer insulating layer, and the lower interlayer insulating layer.

3. The method according to claim 2, wherein the conductive layer pattern is a tungsten layer pattern, a titanium nitride layer pattern, or a polysilicon layer pattern.

4. The method according to claim 2, wherein the preliminary alignment key pattern further comprises an insulating layer pattern covering sidewalls and an upper surface of the conductive layer pattern, and the insulating layer pattern is formed of a material layer having an etch selectivity with respect to the first interlayer insulating layer, the second interlayer insulating layer, and the lower interlayer insulating layer.

5. The method according to claim 4, wherein the insulating layer pattern is formed of a silicon nitride layer.

6. The method according to claim 1, wherein the alignment key trench is formed to expose the semiconductor substrate.

7. The method according to claim 1, wherein the alignment key trench is formed to have a width of about 2 to 3 μm.

* * * * *